US008935639B1

(12) United States Patent
Tzeng (10) Patent No.: US 8,935,639 B1
(45) Date of Patent: Jan. 13, 2015

(54) NATIVELY COLOR-AWARE DOUBLE PATTERNING TECHNOLOGY (DPT) COMPLIANT ROUTING

(71) Applicant: Atoptech, Inc., Santa Clara, CA (US)

(72) Inventor: Ping-San Tzeng, Fremont, CA (US)

(73) Assignee: Atoptech, Inc., Santa Clara, CA (US)

( * ) Notice: Subject to any disclaimer, the term of this patent is extended or adjusted under 35 U.S.C. 154(b) by 0 days.

(21) Appl. No.: 13/779,615

(22) Filed: Feb. 27, 2013

Related U.S. Application Data

(60) Provisional application No. 61/694,619, filed on Aug. 29, 2012.

(51) Int. Cl.
*G06F 17/50* (2006.01)

(52) U.S. Cl.
CPC .................................. *G06F 17/5077* (2013.01)
USPC .................. 716/55; 716/50; 716/52; 716/54; 716/56; 430/5; 430/30

(58) Field of Classification Search
CPC . G06F 17/50; G06F 17/5077; G06F 17/5081; G06F 2217/12; G03F 7/70466
USPC ...................................... 716/50–56; 430/5, 30
See application file for complete search history.

(56) References Cited

U.S. PATENT DOCUMENTS

| 8,239,806 | B2 * | 8/2012 | Chen et al. ..................... 716/126 |
| 8,245,174 | B2 * | 8/2012 | Cheng et al. ................... 716/126 |
| 8,375,348 | B1 * | 2/2013 | Raj et al. ........................ 716/126 |
| 8,560,998 | B1 * | 10/2013 | Salowe et al. ................. 716/126 |
| 2002/0038204 | A1 * | 3/2002 | Yonemori ........................ 703/19 |
| 2011/0023002 | A1 * | 1/2011 | Cheng et al. ................... 716/126 |
| 2011/0119648 | A1 * | 5/2011 | Chen et al. ..................... 716/126 |
| 2013/0091476 | A1 * | 4/2013 | Chen et al. ....................... 716/55 |
| 2013/0132913 | A1 * | 5/2013 | Fu et al. .......................... 716/51 |
| 2013/0179848 | A1 * | 7/2013 | Liu et al. ......................... 716/55 |
| 2013/0244427 | A1 * | 9/2013 | Yuan et al. .................... 438/689 |
| 2013/0254726 | A1 * | 9/2013 | Hsu et al. ........................ 716/53 |
| 2013/0263065 | A1 * | 10/2013 | Chen et al. ....................... 716/55 |
| 2013/0263066 | A1 * | 10/2013 | Chen et al. ....................... 716/55 |

* cited by examiner

*Primary Examiner* — Nha Nguyen
(74) *Attorney, Agent, or Firm* — Van Pelt, Yi & James LLP (57) ABSTRACT

A route technique includes: receiving an input specifying a plurality of semiconductor device components and their logical connections; determining route information pertaining to a plurality of routes that connect in one or more metal layers the semiconductor device components according to their logical connections, the determination being based at least in part on a plurality of predefined tracks associated with a metal layer; and outputting at least a portion of the route information. A first portion of the plurality of predefined tracks corresponds to a first color and a second portion of the plurality of predefined tracks corresponds to a second color.

21 Claims, 12 Drawing Sheets

NATIVELY COLOR-AWARE DOUBLE PATTERNING TECHNOLOGY (DPT) COMPLIANT ROUTING

CROSS REFERENCE TO OTHER APPLICATIONS

This application claims priority to U.S. Provisional Patent Application No. 61/694,619 entitled DOUBLE-PATTERNING-TECHNOLOGY COMPLIANT ROUTING WITH PARTIAL PRE-COLORING filed Aug. 29, 2012 which is incorporated herein by reference for all purposes.

BACKGROUND OF THE INVENTION

Today's semiconductor devices often comprise multiple layers of metal. Semiconductor place-and-route (P&R) tools are used to place and connect logical blocks (also referred to as cells) of circuit designs. During the P&R process, the resolution of the wires on the semiconductor device and spacing between wires must be considered, and a number of challenges exist.

Diffraction of light used in photolithography has a negative impact on the resolution of the wires that are manufactured. Generally, the smaller the wavelength of the light, the less severe the negative effects of diffraction. As circuits become more complex, the density of cells increases, and the size of the wires decreases. Consequently, the wavelength of the light source used in lithography also needs to decrease to meet the required resolution. Moreover, the light source must provide adequate intensity. In practice, however, the number of viable low wavelength light sources that also provide adequate intensity is limited. Because semiconductor manufacturing equipment is expensive, it is often not economical to replace existing light sources on the installed base of semiconductor manufacturing equipment. In addition, there must be adequate spacing between distinct wires, so that any imprecision in the resolution of the wires would not result in wires becoming disconnected or connected inadvertently.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Double Patterning Technology (DPT) is developed to address the challenges of existing semiconductor fabrication processes. To improve the density of the circuit, multiple masks are used to form multiple patterns within a single layer of metal. As used herein, a color refers to a pattern that can be produced using a single mask. Within the same color, features need to be spaced sufficiently far apart to meet a minimum spacing requirement that is empirically determined to avoid inadvertent connections or disconnections of wires due to processing inaccuracies. This minimum spacing permitted the semiconductor fabrication technology using a single color is referred to as Same-Photo-Mask Minimum Spacing (S-min), and is on the order of 63 nm for some existing fabrication technologies. Different colors that correspond to the same layer are processed using multiple masks and are interwoven to form an individual layer. Features of different colors need to meet another empirically determined minimum spacing requirement to avoid inadvertent connections or disconnections. This minimum spacing permitted by the semiconductor processing technology using different colors is referred to as Different-Photo-Mask Minimum Spacing (D-min). D-min is less than S-min and is on the order of 32 nm for some existing fabrication technologies.

Figure 1A:
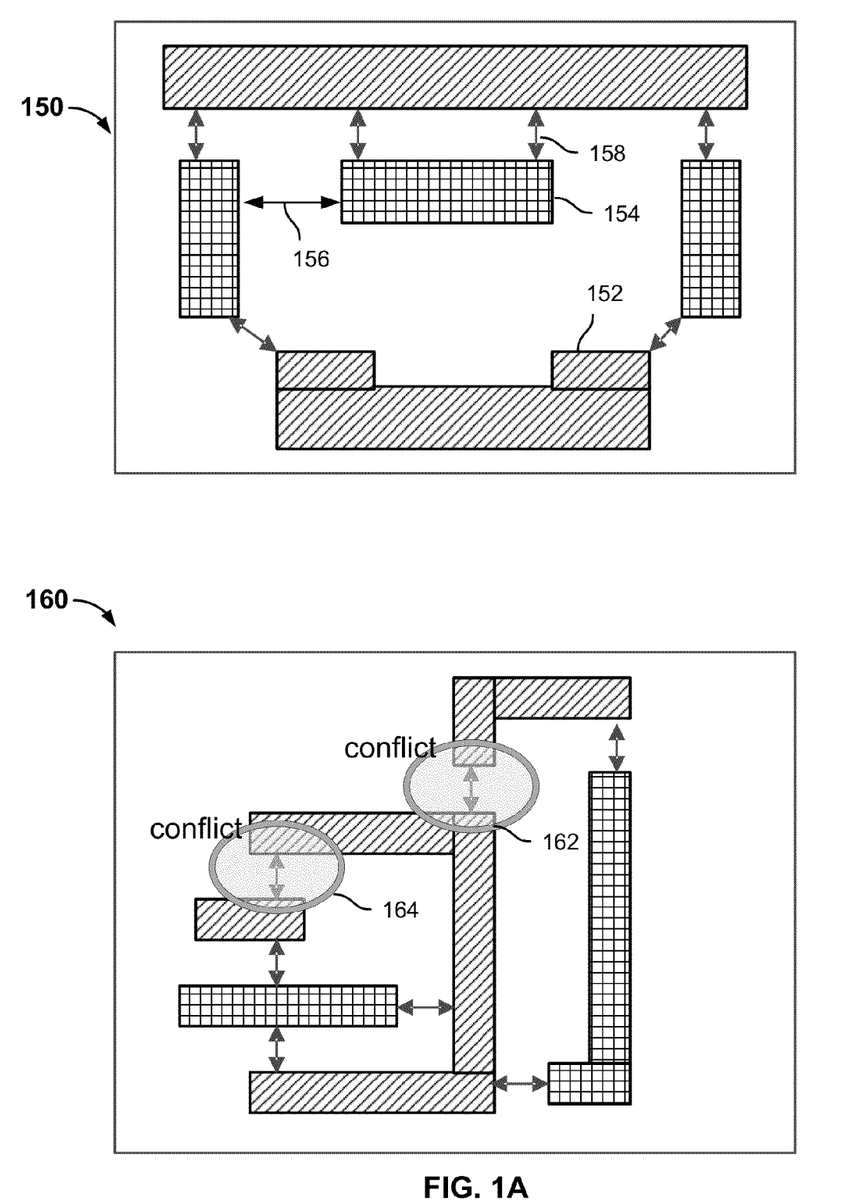
FIG. 1A shows example route layouts.

Different layers of metal wires are connected using vias to form the final routing of all nets. FIG. 1A shows example route layouts. Route layout 150 is a DPT-compliant example. Specifically, colors 152 and 154 (represented using different shading patterns) are generated using separate masks. The minimum distance between features of each color (e.g., distance 156) meets the S-min requirement of the photolithography process of a single mask. When the colors are interposed to form the combined pattern 150, D-min is met. Since D-min is less than S-min, higher resolution is achieved.

Route layout 160 is not DPT-compliant because, at locations 162 and 164, there are conflicts due to adjacent features of a color not meeting the S-min requirement.

Currently, the P&R tools are not required to handle the layout of multiple masks and their corresponding colors. Instead, the foundry, which creates the masks, typically sets forth certain requirements (e.g., requiring an even number of cycles in a graph that corresponds to the circuit) that the P&R tool must fulfill to ensure DPT compliance and generates a layout that fulfills the requirements but without regard for multiple masks, and the foundry performs the separation of different layers based on the layout. Referring to FIG. 1A, the P&R tool produces a combined layout 150 without specifying different colors. The layout does need to adhere to a set of rules (e.g., avoid minimum-spacing odd cycles in the layout) to guarantee that there is at least one valid DPT compliant solution. In other words, the output of the P&R tool can be sent to a third party such as the foundry, which separates out different colors (which can be 152 and 154 or some other combination where each color meets the minimum spacing requirement individually). Such a process is referred to as a colorless DPT process. A number of potential issues exist with the colorless DPT process, including complexity in determining if the layout of a design is free of minimum-spacing odd cycle (which involves solving an NP complete problem), possibly missed rule violations and unnecessary consumption of routing resources to support user-defined net pre-coloring, and to avoid cross-hierarchical odd-cycles.

Natively color aware routing is disclosed. In some embodiments, a template with tracks having predefined colors is used during the process. The tracks are designed to generate DPT compliant results. During the routing process, a piece of wire (also referred to as a polygon) is positioned on a track if possible, and is assigned the same color as the track on which the wire is positioned (or the same color as other wires to which this wire is connected if the wire is not positioned on a track). Certain rules governing the minimum distance between adjacent polygons are observed, such that routes of the same color are at least S-min distance apart, and routes of different colors are at least D-min distance apart. Such a process is referred to as a natively color aware routing process because the construction process guarantees that a DPT compliant solution exists for the output. In some embodiments, the routing process further permits pre-coloring of one or more portions of a circuit (referred to as a net). For example, critical nets such as clock trees and pins of macros can be pre-colored, and the natively color aware P&R process will generate a DPT compliant solution that takes into account the pre-coloring.

Figure 1B:
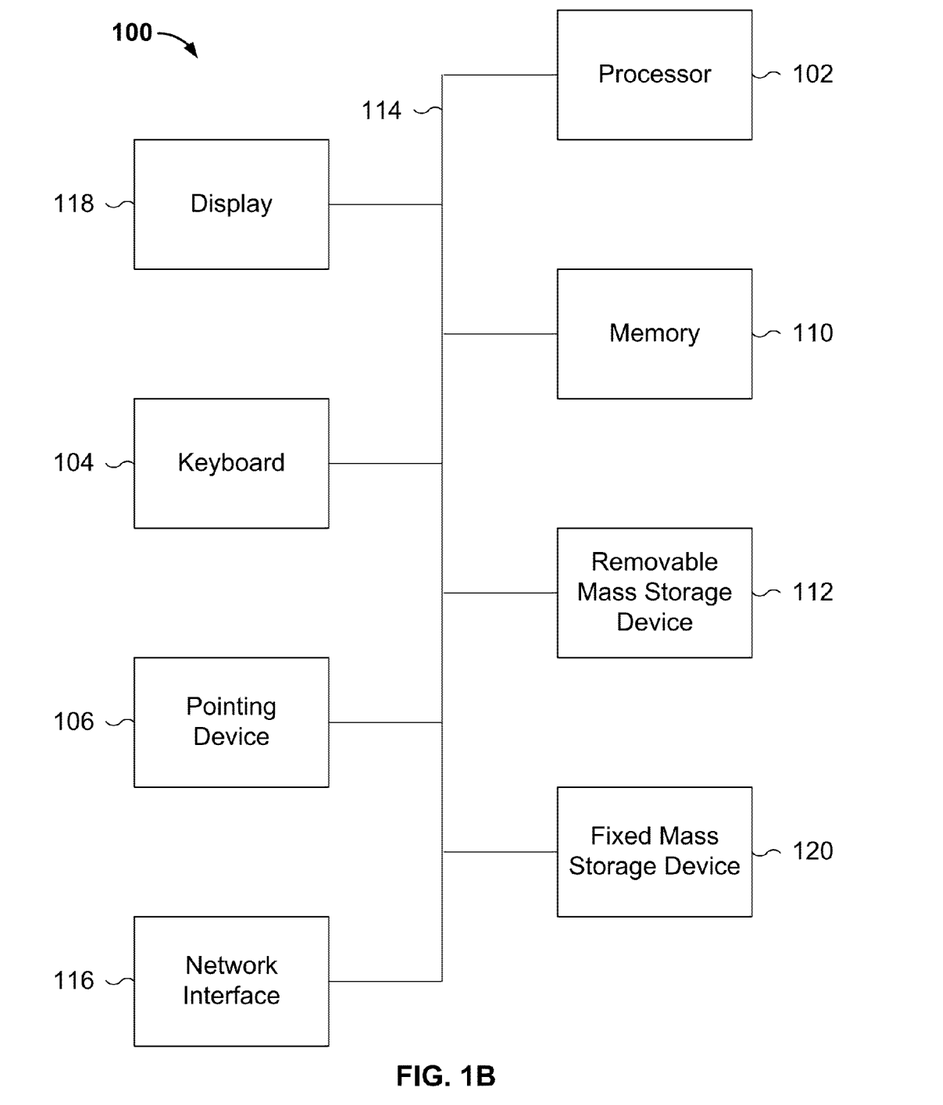
FIG. 1B is a functional diagram illustrating a programmed computer system for performing P&R in accordance with some embodiments.

FIG. 1B is a functional diagram illustrating a programmed computer system for performing P&R in accordance with some embodiments. As will be apparent, other computer system architectures and configurations can be used to perform P&R. Computer system 100, which includes various subsystems as described below, includes at least one microprocessor subsystem (also referred to as a processor or a central processing unit (CPU)) 102. For example, processor 102 can be implemented by a single-chip processor or by multiple processors. In some embodiments, processor 102 is a general purpose digital processor that controls the operation of the computer system 100. Using instructions retrieved from memory 110, the processor 102 controls the reception and manipulation of input data, and the output and display of data on output devices (e.g., display 118). In some embodiments, processor 102 includes and/or is used to execute the processes described below in connection with FIGS. 2A and 2B.

Processor 102 is coupled bi-directionally with memory 110, which can include a first primary storage, typically a random access memory (RAM), and a second primary storage area, typically a read-only memory (ROM). As is well known in the art, primary storage can be used as a general storage area and as scratch-pad memory, and can also be used to store input data and processed data. Primary storage can also store programming instructions and data, in the form of data objects and text objects, in addition to other data and instructions for processes operating on processor 102. Also as is well known in the art, primary storage typically includes basic operating instructions, program code, data and objects used by the processor 102 to perform its functions (e.g., programmed instructions). For example, memory 110 can include any suitable computer-readable storage media, described below, depending on whether, for example, data access needs to be bi-directional or uni-directional. For example, processor 102 can also directly and very rapidly retrieve and store frequently needed data in a cache memory (not shown).

A removable mass storage device 112 provides additional data storage capacity for the computer system 100, and is coupled either bi-directionally (read/write) or uni-directionally (read only) to processor 102. For example, storage 112 can also include computer-readable media such as magnetic tape, flash memory, PC-CARDS, portable mass storage devices, holographic storage devices, and other storage devices. A fixed mass storage 120 can also, for example, provide additional data storage capacity. The most common example of mass storage 120 is a hard disk drive. Mass storage 112, 120 generally store additional programming instructions, data, and the like that typically are not in active use by the processor 102. It will be appreciated that the information retained within mass storage 112 and 120 can be incorporated, if needed, in standard fashion as part of memory 110 (e.g., RAM) as virtual memory.

In addition to providing processor 102 access to storage subsystems, bus 114 can also be used to provide access to other subsystems and devices. As shown, these can include a display monitor 118, a network interface 116, a keyboard 104, and a pointing device 106, as well as an auxiliary input/output device interface, a sound card, speakers, and other subsystems as needed. For example, the pointing device 106 can be a mouse, stylus, track ball, or tablet, and is useful for interacting with a graphical user interface.

The network interface 116 allows processor 102 to be coupled to another computer, computer network, or telecommunications network using a network connection as shown. For example, through the network interface 116, the processor 102 can receive information (e.g., data objects or program instructions) from another network or output information to another network in the course of performing method/process steps. Information, often represented as a sequence of instructions to be executed on a processor, can be received from and outputted to another network. An interface card or similar device and appropriate software implemented by (e.g., executed/performed on) processor 102 can be used to connect the computer system 100 to an external network and transfer data according to standard protocols. For example, various process embodiments disclosed herein can be executed on processor 102, or can be performed across a network such as the Internet, intranet networks, or local area networks, in conjunction with a remote processor that shares a portion of the processing. Additional mass storage devices (not shown) can also be connected to processor 102 through network interface 116.

An auxiliary I/O device interface (not shown) can be used in conjunction with computer system 100. The auxiliary I/O device interface can include general and customized interfaces that allow the processor 102 to send and, more typically, receive data from other devices such as microphones, touch-sensitive displays, transducer card readers, tape readers, voice or handwriting recognizers, biometrics readers, cameras, portable mass storage devices, and other computers.

In addition, various embodiments disclosed herein further relate to computer storage products with a computer readable medium that includes program code for performing various computer-implemented operations. The computer-readable medium is any data storage device that can store data which can thereafter be read by a computer system. Examples of computer-readable media include, but are not limited to, all the media mentioned above: magnetic media such as hard disks, floppy disks, and magnetic tape; optical media such as CD-ROM disks; magneto-optical media such as optical disks; and specially configured hardware devices such as application-specific integrated circuits (ASICs), programmable logic devices (PLDs), and ROM and RAM devices. Examples of program code include both machine code, as produced, for example, by a compiler, or files containing higher level code (e.g., script) that can be executed using an interpreter.

The computer system shown in FIG. 1B is but an example of a computer system suitable for use with the various embodiments disclosed herein. Other computer systems suitable for such use can include additional or fewer subsystems. In addition, bus 114 is illustrative of any interconnection scheme serving to link the subsystems. Other computer architectures having different configurations of subsystems can also be utilized.

Figure 2A:
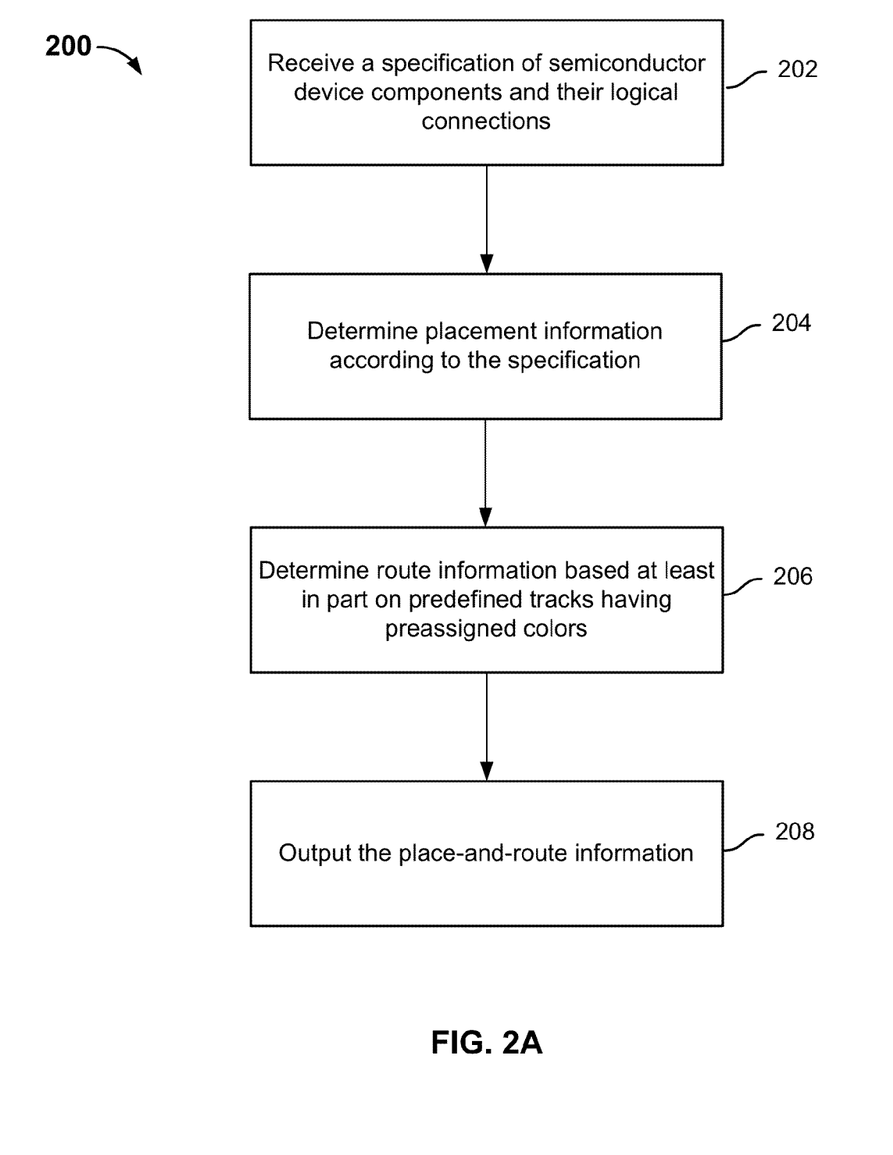
FIG. 2A is a flowchart illustrating an embodiment of a place-and-route process.

FIG. 2A is a flowchart illustrating an embodiment of a P&R process. Process 200 can be performed on a system such as 100.

At 202, a specification of semiconductor device components and their logical connections is received by a P&R tool that is implemented on a system such as 100 of FIG. 1B. In some embodiments, the semiconductor device that is specified has multiple metal layers. In some embodiments, the specification includes a Graphic Data System (GDS) file that describes cells and pins of the cells. Various types of files, such as PRLIB files by AtopTech, standard cell library files, netlists, and other appropriate circuit specification files can be used as input into the P&R tool. In some embodiments, the specification further includes pre-coloring information of a portion of the circuit that will be undergoing the P&R process.

At 204, placement information according to the specification is determined. The placement information can be determined using known conventional techniques.

At 206, route information associated with the routes that connect the semiconductor device components according to their logical connections is determined. The determination is based at least in part on predefined tracks with pre-assigned colors, and is subject to a set of distance rules. In some embodiments, the determination is subject to pre-coloring, and the route information indicates whether the route is a user-defined color 1, user-defined color 2, program-defined color 1, program-defined color 2, or user-defined color X. Details of how to determine the routing information are described below.

At 208, the route information (e.g., the polygon shapes/positions) is output. In some embodiments, at least some of the corresponding colors of the routes are included in the output. In some embodiments, all the routes and corresponding colors are output. In some embodiments, user-defined colors are output along with the corresponding routes, while program-defined colors are not output along with the corresponding routes, so that a third party such as a foundry can determine the colors of the uncolored routes to best suit its practices (e.g., forming masks used for manufacturing). As discussed above, at least one coloring solution exists on a DPT compliant routing output even though some of the color information is omitted in the output. Placement information is also output in some embodiments.

Figure 2B:
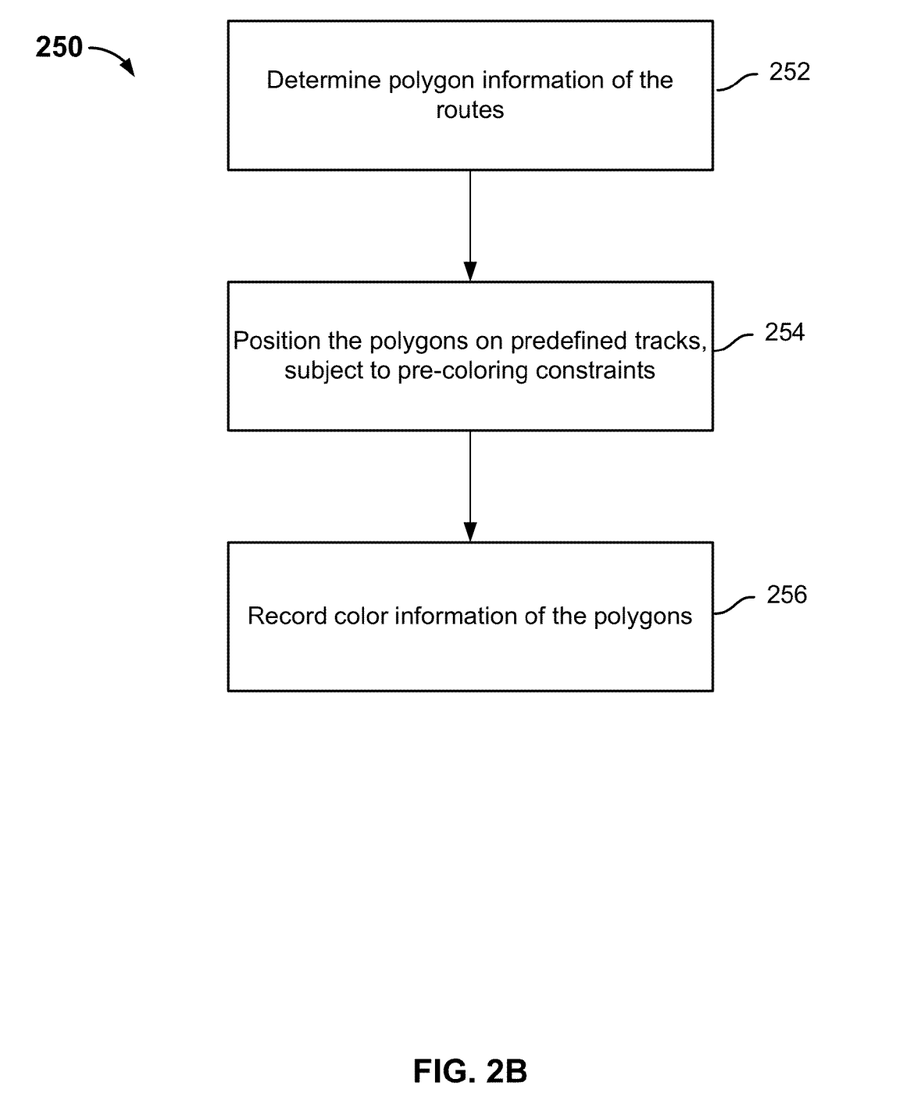
FIG. 2B is a flowchart illustrating an embodiment of a process for determining the routing information.

FIG. 2B is a flowchart illustrating an embodiment of a process for determining routing information. Process 250 can be used to implement 206 of process 200.

At 252, routing information associated with a net is determined. The routing information includes specific pieces of wires (also referred to as polygons) used to form the routes, the approximate location, width and length of the wires, layer information pertaining to the wires, etc.

In some embodiments, the wires (also referred to as polygons), which connect the semiconductor device components in one or more metal layers, are initially determined using standard routing techniques such as Steiner-Tree routing or Maze routing. Initial routing information pertaining to connections, approximate locations, width and length of the wires, etc., are determined. As will be described in greater detail below, the initial routing information is refined by positioning wires on predefined tracks as appropriate, subject to any pre-coloring constraints. In some embodiments, a first portion of the tracks corresponds to a first color and a second portion of the tracks corresponds to a second color. The tracks are laid out in alternating colors. Each piece of wire that is positioned on a track or is connected to another piece of wire positioned on a track is assigned the same color as the track. In addition, the routing process observes a set of distance rules, which are described in greater detail below. The natively color-aware construction process means that if a routing solution can be found, the solution will satisfies the DPT requirements.

At 254, at least some of the polygons are positioned on one or more sets of predefined tracks, subject to minimum distance rules and any pre-coloring constraints.

As used herein, a set of predefined tracks corresponds to a layer of metal. Each track is assigned a color, and two colors are used for one set of predefined tracks. Adjacent tracks are assigned different colors. A polygon is positioned on a predefined track if appropriate, and is assigned the same color as the track. In some situations, such as when a polygon needs to be oriented in a different direction than the tracks, the polygon can be positioned off-track. An off-track polygon is assigned the same color as the polygons to which it is connected.

In some embodiments, positioning the polygons is subject to pre-coloring constraints. For example, a user can specify that a connection needs to be a specific color. The polygons of the corresponding route are therefore positioned on one or more tracks assigned the specific color as much as possible. The user can also specify that certain routes need to be the same color without specifying which color they must be. Accordingly, the polygons associated with the routes are positioned on tracks of the same color as appropriate.

Positioning the polygons is subject to a set of minimum distance rules. Specifically, neighboring polygons of the same color (including the same user specified color) are required to be positioned at least S-min distance apart, and neighboring polygons of different colors are required to be positioned at least D-min distance apart.

Standard P&R rules also apply. For example, wires cannot cross each other in the same layer. Many such rules exist and are outside the scope of this this disclosure.

The P&R tool checks for these rules and constraints while positioning the polygons. In some embodiments, the process is iterative and the positions of the polygons can be adjusted several times (subject to the constraints each time) until a solution that meets all the requirements is found.

At 256, the position and color information of the polygons is recorded so that it can be output to a third party such as the foundry.

Figure 3:
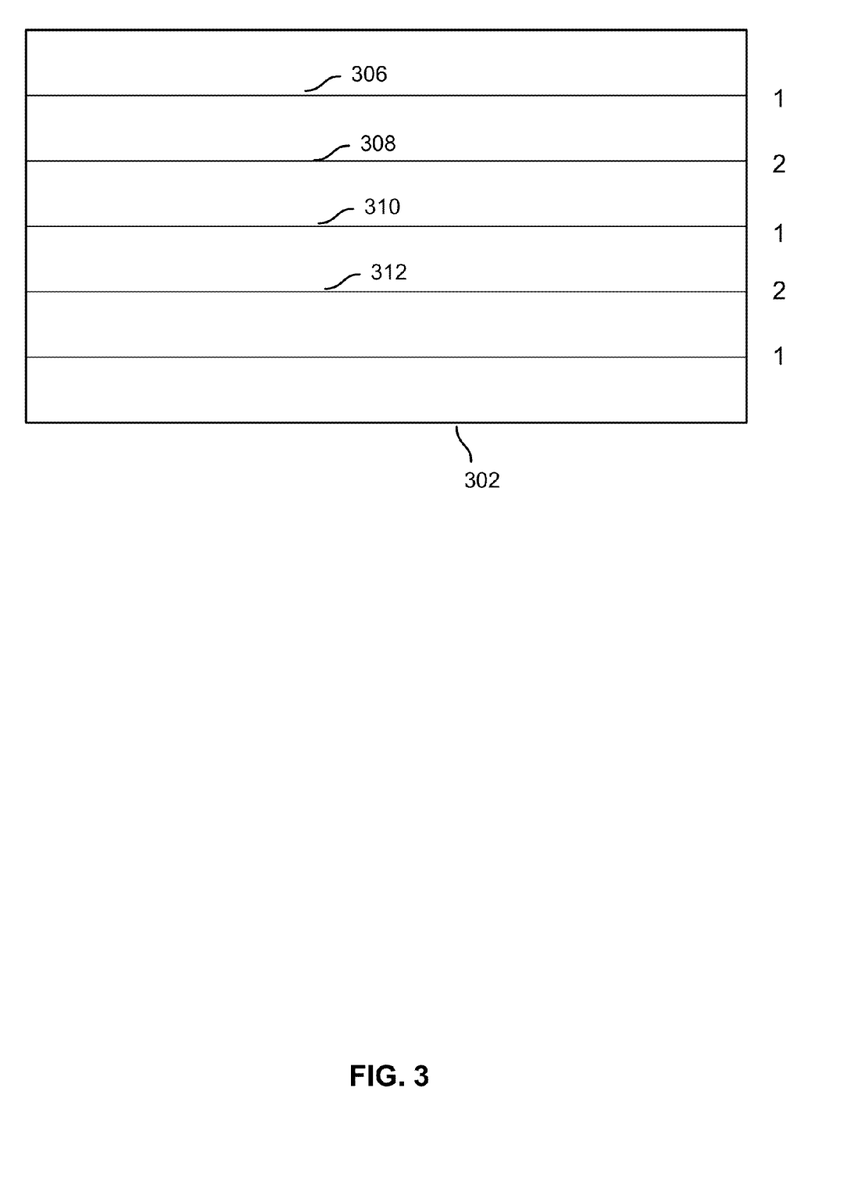
FIG. 3 includes diagrams illustrating example layout templates with preconfigured tracks.

FIG. 3 illustrates diagrams of example layout templates with preconfigured tracks. Template 302 includes preconfigured tracks (e.g., 306, 308, 310, etc.). A template corresponds to a single layer of metal. The tracks can be laid out in the horizontal direction (as shown in FIG. 3), in the vertical direction or any other appropriate orientation (not shown). The direction in which the tracks are laid out is referred to as the preferred direction. In a template layout, a color is pre-specified for each track, and two colors are assigned to the tracks in an interweaving manner. In other words, two adjacent tracks are assigned different colors. For example, track 306 is assigned color 1 (white), track 308 is assigned color 2 (black), track 310 is assigned color 1 again, etc. The choice of actual colors used is arbitrary so long as the two colors are different. The use of different colors is mainly to make the visual representations more user-friendly. Other representations of the tracks can be used. For example, two different shades, patterns, codes, or the like can be used in some implementations.

Each piece of metal wire polygon is positioned on a track if possible, and received the same color assignment as the track. If a polygon cannot be positioned on a track (e.g., the polygon is oriented differently than the preferred direction of the track), the off-track polygon will receive the same color assignment as a polygon that is positioned on a track and to which the off-track polygon is connected. Wires of the same color assignment are fabricated using a single mask. For example, wires positioned on tracks 306 and 310 are assigned color 1 and are fabricated using a single mask, and wires positioned on tracks 308 and 312 are assigned color 2 and are fabricated using a different mask.

Since different colored patterns are fabricated using different masks to form an interwoven pattern, the minimum DPT-compliant spacing between two adjacent wires of different colors (i.e., D-min) is less than S-min, thus allowing higher density of wires. In the examples shown, the tracks are separated by a distance of D-min plus the minimum width of the wire.

The templates conceptually illustrate how the natively color-aware P&R process is accomplished. They can be implemented by using data structures that represent the template layout, and/or by specifying a set of layout rules that the P&R tool follows (e.g., two adjacent wires parallel to each other must be positioned min-space apart and assigned different colors).

Figure 4A:
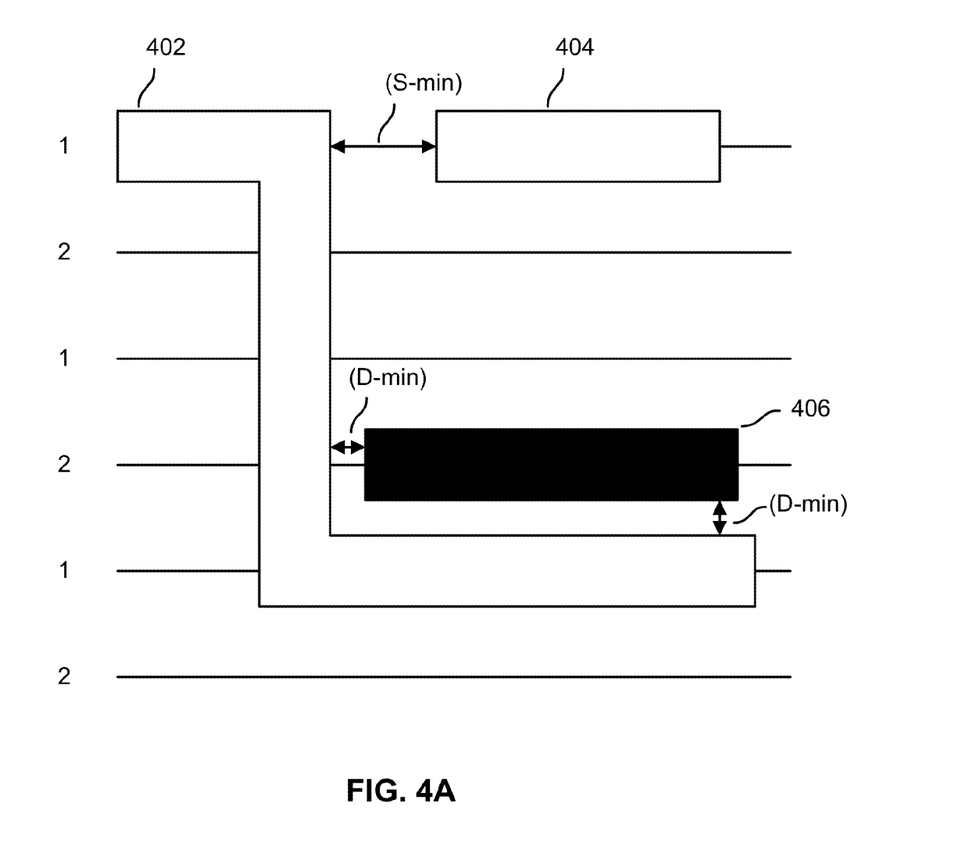
FIG. 4A-4D are layout diagrams illustrating various DPT compliant route examples.

FIG. 4A is a layout diagram illustrating an example route. In this example, polygons 402, 404, and 406 are obtained using conventional techniques (e.g., Steiner Tree routing or Maze routing), and need to be positioned in the same layer. A template similar to 300 is used to position the polygons. In this example, polygon 402 has portions that are positioned on two separate tracks both assigned color 1, and a portion that is positioned off track (because this portion is perpendicular with respect to the orientation of the tracks). Polygon 404 is positioned on a track of color 1, and polygon 406 is positioned on a track of color 2. Subject to the minimum distance constraint, polygons 402 and 404, which are assigned the same color, are separated by a minimum distance of S-min. Polygons 402 and 406, which are assigned different colors, are separated by a minimum distance of D-min. In some embodiments, the output of the P&R tool includes the information shown in table 1. Note that the color designation P1 (or P2) refers to program-defined color 1 (or program-defined color 2) since the colors are specified by the P&R programmatically (as opposed to by the user). The output of the program-defined colors to foundry is optional since the foundry may wish to find its own solution of DPT compliant coloring and not be constrained with the program-defined colors of the P&R tool. Accordingly, the column of "output color to foundry" is used to indicate whether the color is to be included in the output.

TABLE 1

| Polygon ID | Location | Color | Output color to foundry? |
|---|---|---|---|
| 402 | (xa1, ya1), ..., (xai, yai) | P1 | No |
| 404 | (xb1, yb1), ..., (xbi, ybi) | P1 | No |
| 406 | (xc1, yc1), ..., (xci, yci) | P2 | No |

In the example shown in FIG. 4A, the P&R tool determines the full set of colors of the layout automatically. There are situations where it is desirable to allow partial pre-coloring. Partial pre-coloring refers to the specification of a color of a portion of the circuit before the circuit undergoes the P&R process. For example, since there can be different ways to layout the colors, the electrical properties of the circuit (e.g., parasitic capacitance, resistance, etc.) can vary depending on the particular color layout. In some cases, such as in the case of a critical net (e.g., a clock net) with a certain limit on its timing requirement, the layout of the wires needs to be precisely controlled so that the electrical properties of the circuitry are predictable and the timing requirement of the device is met. Thus, the user may wish to specify that all the wires in the critical net belong to a particular color. In some other cases, the pins of certain circuit blocks such as cell macros need to be pre-colored to match the fixed wiring within the circuit blocks. Accordingly, in some embodiments, the P&R tool is designed to permit the user to pre-color at least a portion of the net as U1 (user-defined color 1), U2 (user-defined color 2), or X (where the user indicates that the portion of the net can be either color 1 or color 2 so long as one color is used). The pre-color specifications are included as a part of the input to the P&R tool. The P&R tool determines the polygons using conventional techniques, and then places the polygons corresponding to the user's pre-colored portion on appropriate tracks according to the predefined color specification. The remaining wires are positioned on the tracks according to the natively color-aware P&R process. Again, because a track-based layout is guaranteed to be DPT compliant, a solution that both satisfies the pre-coloring requirements specified by the user and the DPT spacing requirement is found as soon as the wires are positioned.

Referring again to FIG. 4A, suppose that route 402 is pre-colored by the user to correspond to color 1, and routes 404 and 406 are not pre-colored (i.e., they can be any color). As such, the solution shown in FIG. 4A meets the user specification since the polygon corresponding to route 402 is assigned color 1. Other solutions are possible. In some embodiments, the output includes the information shown in Table 2. In this example, the user-defined color information U1 is included in the output to the foundry and the program-defined color information is omitted from the output so that the foundry can define its own colors.

TABLE 2

| Polygon ID | Location | Color | Output color to foundry? |
|---|---|---|---|
| 402 | (xa1, ya1), . . . , (xai, yai) | U1 | Yes |
| 404 | (xb1, yb1), . . . , (xbi, ybi) | P1 | No |
| 406 | (xc1, yc1), . . . , (xci, yci) | P2 | No |

Figure 4B:
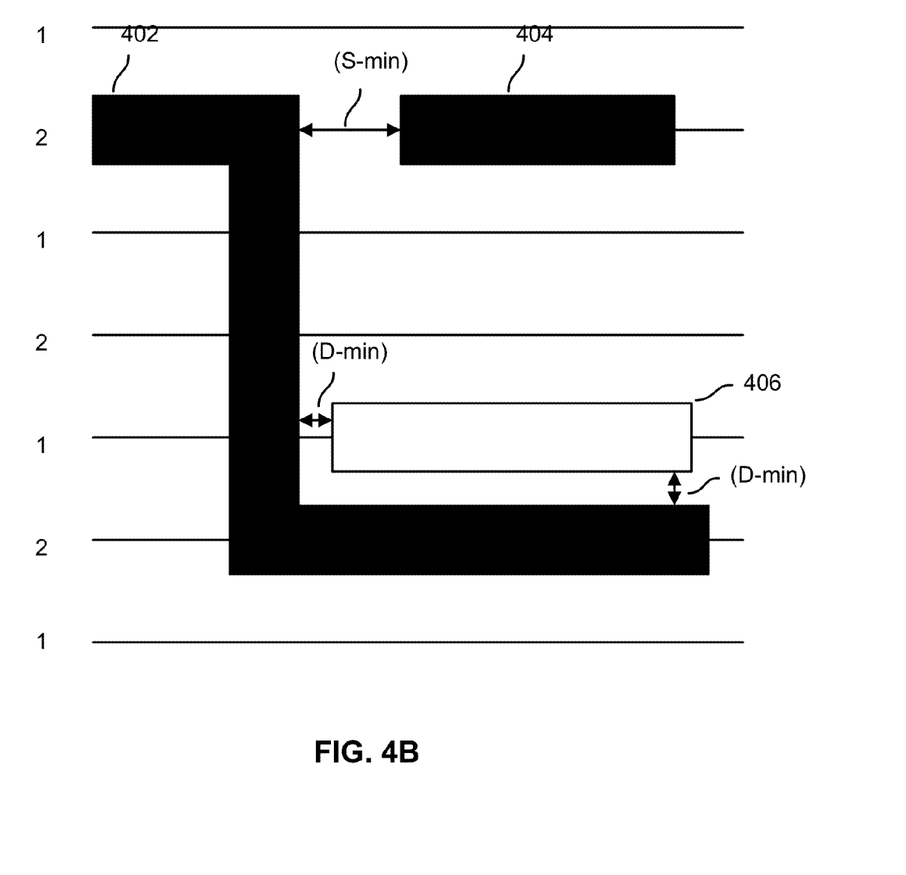

If, however, in FIG. 4A, route 402 is pre-colored to correspond to color 2, and route 404 is not pre-colored, then the solution shown in FIG. 4A is no longer valid. By observing the pre-coloring constraint and using the natively color-aware P&R techniques, the solution shown in FIG. 4B is found to be valid although other solutions are possible. The following information is included in output in some embodiments:

TABLE 3

| Polygon ID | Location | Color | Output color to foundry? |
|---|---|---|---|
| 402 | (xa1, ya1), . . . , (xai, yai) | U2 | Yes |
| 404 | (xb1, yb1), . . . , (xbi, ybi) | P2 | No |
| 406 | (xc1, yc1), . . . , (xci, yci) | P1 | No |

Figure 4C:
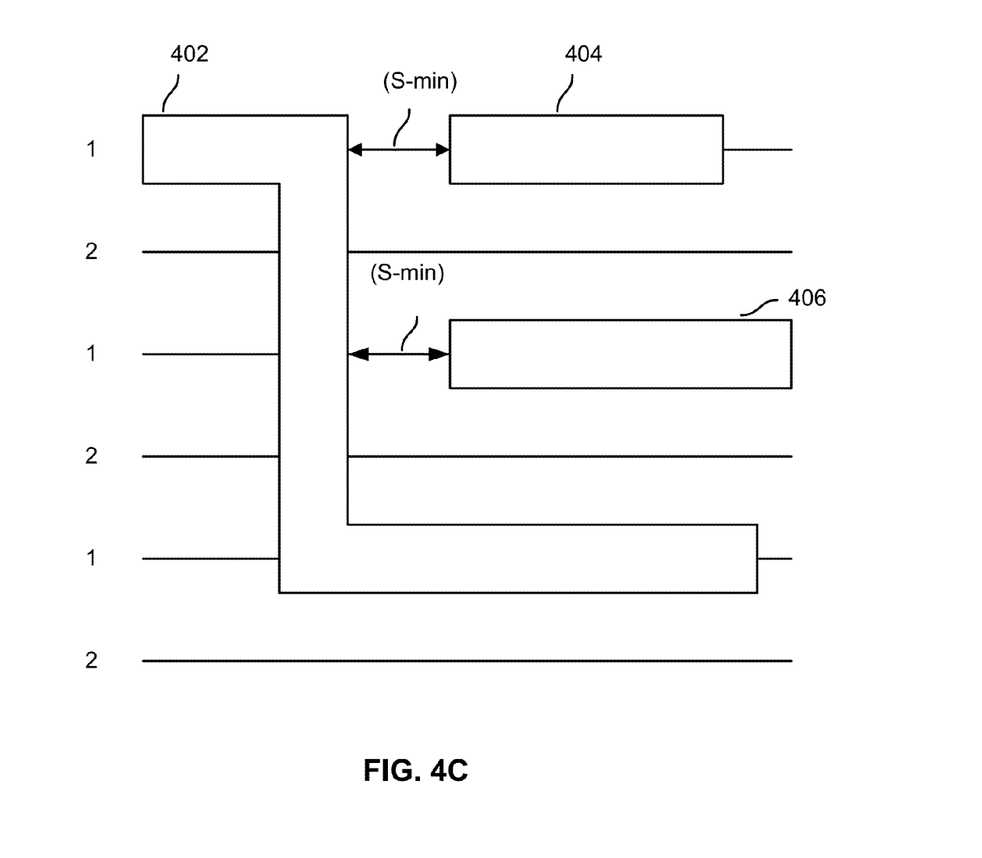
Figure 4D:
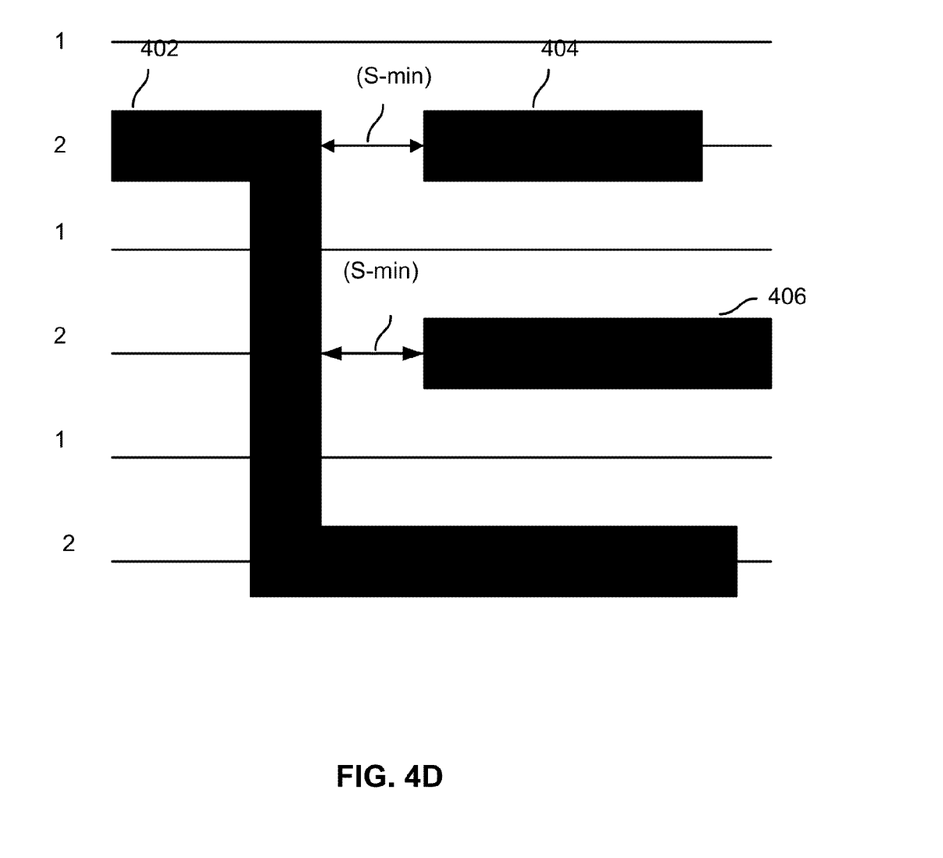

If the user pre-colors all the routes to correspond to color 1, a different solution will be determined by the P&R tool. In this solution (as shown in FIG. 4C), all the polygons would be positioned on color 1 tracks. The minimum distance between the polygons are now S-min since they are the same color. If the user pre-colors all the routes to correspond to color 2, a solution (as shown in FIG. 4D) where all the polygons are positioned on color 2 tracks would be found. Alternatively, the user can also specify that all the routes correspond to color X, which means that the routes are the same color (i.e., either color 1 or color 2). In such a case, either FIG. 4C or FIG. 4D serves as a valid solution.

In some cases, the input received by the P&R tool includes portions that are not modifiable. For example, a hierarchical circuit design can include macros from a cell library. Since the macros are predesigned logical blocks (e.g., adders, multipliers, processing units, etc.), the internal wiring of the macros are typically opaque to the P&R tool and not modifiable. The designers of the macros are responsible for making sure that the internal wiring of the macros are DPT compliant; thus, for purposes of the specification, it is assumed that the macros are DPT compliant internally before the whole circuit including the macros undergoes the P&R process. A macro includes pins that function as interfaces connecting circuitry on the inside of the macro to circuitry on the outside of the macro. Thus, in some embodiments, the pins are pre-colored to match the colors of the internal wiring.

Figure 5:
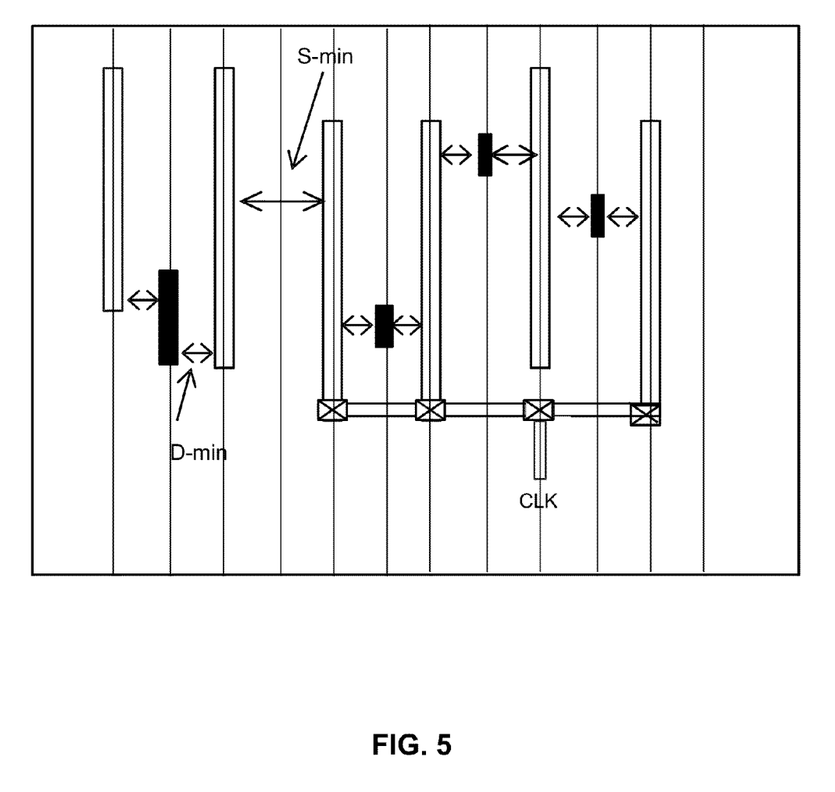
FIG. 5 is a diagram illustrating another example layout with pre-coloring.

FIG. 5 is a diagram illustrating another example layout with pre-coloring. In this example, the clock net is pre-colored to color 1 (white). Without using the tracks to assist the placement of wires, other polygons would need to be positioned at least S-min distance away from the pre-colored clock net. With the assistance of the tracks, as shown in FIG. 5, other polygons without pre-coloring constraints can be positioned on tracks adjacent to the clock net as color 2 (black), resulting in higher wiring density. Minimum spacing rules are also observed.

Figure 6A:
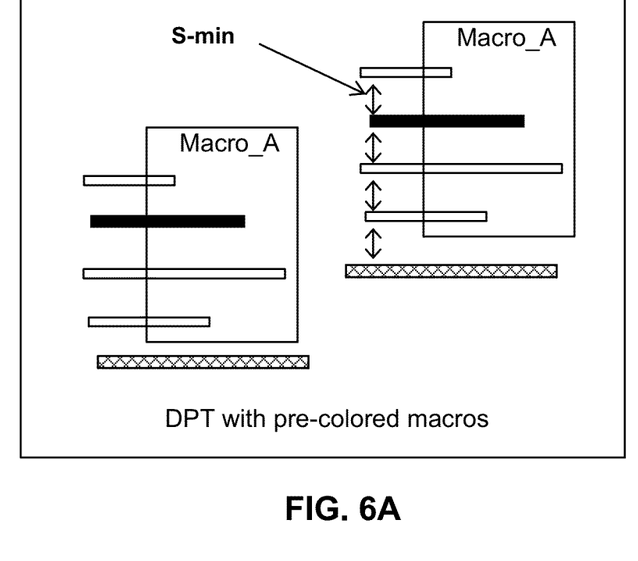
FIG. 6A is a diagram illustrating an example hierarchical design that includes macros and pre-colored pins.

FIG. 6A is a diagram illustrating an example hierarchical design that includes macros and pre-colored pins. In this example, the pins are pre-colored, and the placements of the pins are determined using a conventional P&R tool that does not perform P&R according to a template with tracks. Without using a natively color-aware technique, the P&R tool would need to make pessimistic assumptions and assignments of pin colors to guarantee that the final layout of the pins is DPT compliant. Specifically, the pins are kept at least S-min apart, resulting in lower pin density and lower wire density.

Figure 6B:
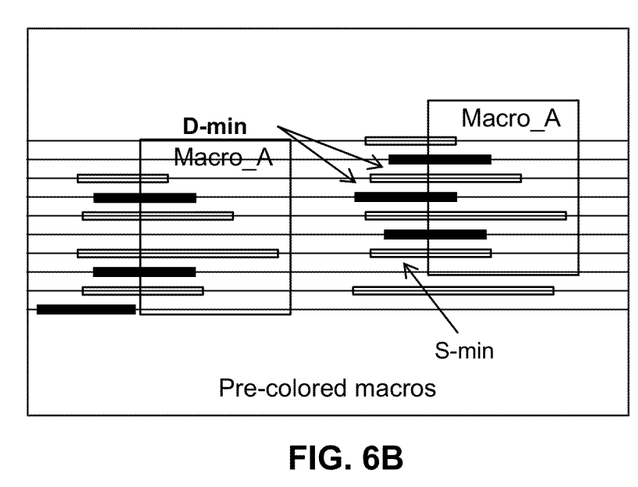
FIG. 6B is a diagram illustrating another example hierarchical design with macros and pre-colored pins.

FIG. 6B is a diagram illustrating another example hierarchical design with macros and pre-colored pins. In this example, the pins are also pre-colored, and the placements of the pins are determined using a natively color-aware P&R technique that uses pre-defined tracks to place wires. Specifically, the pins and external wires are each positioned on tracks, while observing the pre-color assignments and minimum spacing rules. Pin and wire placements that are at least min-space apart are achieved for adjacent pins and wires pre-assigned different colors. Pins and wires of the same color are at least S-min apart.

Figure 7:
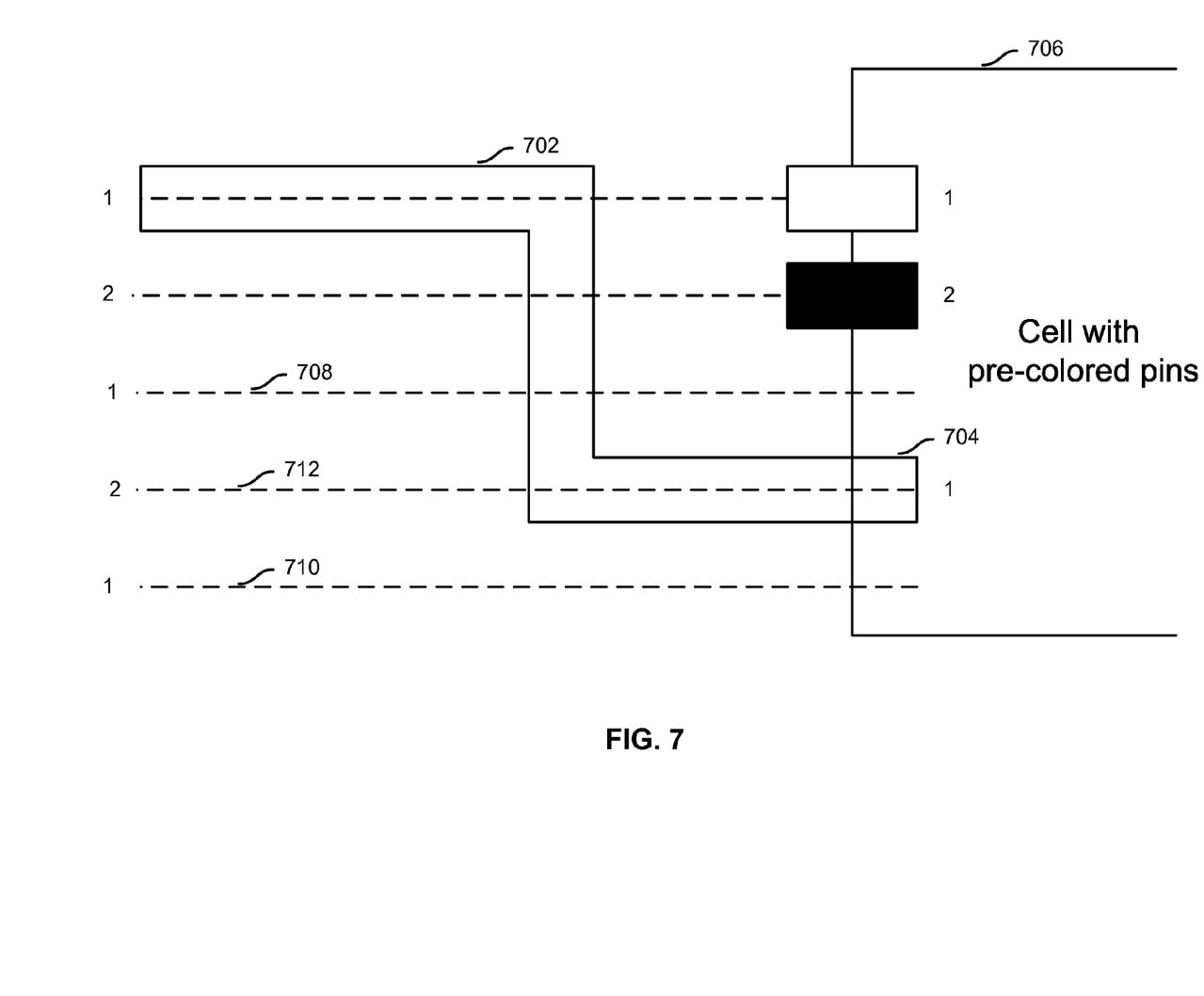
FIG. 7 illustrates an example in which a polygon's color assignment is overwritten.

In some embodiments, when the polygons are positioned, the assignment of the polygon color according to the tracks can be overwritten as appropriate. FIG. 7 illustrates an example in which a polygon color assignment is overwritten. In this example, polygon 702 is assigned color 1. The polygon needs to be connected to pin 704 on a predefined cell 706 (e.g., a macro from a library). Pin 704 is pre-defined to be color 1. Due to constraints of the cell design, pin 704 cannot be positioned on color 1 tracks 708 or 710. Instead, it is positioned on an adjacent color 2 track 712. In this case, the color that would have been assigned to polygon 702 based on track 712's predefined color (i.e., color 2) is overwritten. Instead, polygon 702 is assigned color 1. In some embodiments, the state of override is indicated by using a flag in a data structure representing the polygon. The positioning of polygon 702 still needs to observe the minimum distance rules.

A natively color-aware routing technique is described. By positioning routes on predefined tracks with predefined colors, the resulting routes are guaranteed to be DPT-compliant. While double patterning with two colors is described, the technique is also applicable to N colors (N>2). For example, a track template in which consecutive tracks are assigned colors 1, 2, . . . , N can be used.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A routing method comprising:
receiving an input including circuit information pertaining to a plurality of semiconductor device components and their logical connections, and pre-coloring information of a circuit portion;
determining, using one or more processors, route information pertaining to a plurality of routes that connect in one or more metal layers the semiconductor device components according to their logical connections, the determination being based at least in part on a plurality of predefined tracks associated with a metal layer and at least according to the pre-coloring information; and
outputting at least a portion of the route information; wherein:
a first portion of the plurality of predefined tracks is pre-assigned a first color and a second portion of the plurality of predefined tracks is pre-assigned a second color;

the first color corresponds to a first pattern that is to be produced using a first mask;

the second color corresponds to a second pattern that is to be produced using a second mask;

the pre-coloring information of the circuit portion indicates that at least some of the plurality of routes of the circuit portion correspond to a user-defined color X, which specifies that the at least some of the plurality of routes of the circuit portion are a single color, but does not require the at least some of the plurality of routes of the circuit portion to be associated with a specific color among available colors as long as the at least some of the plurality of routes of the circuit portion are the same color; and polygons associated with the pre-colored circuit portion are determined to correspond to either the first color or the second color.

2. The method of claim 1, wherein the plurality of routes are associated with a plurality of polygons, and the determination is subject to a rule requiring neighboring polygons of the same color to be separated by at least a Same-Photo-Mask Minimum Spacing (S-min).

3. The method of claim 1, wherein the plurality of routes are associated with a plurality of polygons, and the determination is subject to a rule requiring neighboring polygons of different colors to be separated by at least a Different-Photo-Mask Minimum Spacing (D-min).

4. The method of claim 1, wherein adjacent tracks associated with a single metal layer correspond to different colors.

5. The method of claim 1, wherein within a single metal layer, wires positioned on two adjacent tracks have a minimum separation distance that is less than a Same-Photo-Mask Minimum Spacing (S-min) of a single color permitted by a semiconductor fabrication process.

6. The method of claim 1, wherein determining the route information includes determining respective colors of the plurality of routes.

7. The method of claim 6, wherein routes that correspond to the first color are manufactured using a first mask, and routes that correspond to the second color are manufactured using a second mask.

8. The method of claim 1, wherein determining the route information pertaining to the plurality of routes includes:

determining a plurality of polygons based at least in part on the input; and positioning at least some of the plurality of polygons on the plurality of predefined tracks.

9. The method of claim 8, further comprising associating a polygon with a corresponding color of a track on which the polygon is positioned.

10. The method of claim 8, wherein the route information includes position information associated with the plurality of polygons.

11. The method of claim 1, wherein the input further includes specification of a pre-colored net.

12. The method of claim 11, wherein the pre-colored net includes a clock tree.

13. The method of claim 11, wherein the pre-colored net includes a critical net.

14. The method of claim 11, wherein the pre-colored net includes a pre-colored pin of a macro.

15. The method of claim 1, wherein the input further includes a specification of a color of a route as a user-defined color or a program-defined color.

16. The method of claim 1, wherein the input further includes a specification of a color of a route as one of: user-defined color 1, user-defined color 2, program-defined color 1, program-defined color 2, or user-defined color X.

17. The method of claim 1, wherein the route information pertaining to one of the plurality of routes indicates that the one of the plurality of routes is one of: user-defined color 1, user-defined color 2, program-defined color 1, program-defined color 2, or user-defined color X.

18. The method of claim 1, further comprising determining placement information of the plurality of semiconductor device components.

19. The method of claim 1, further comprising overwriting a color assignment of a route, wherein the color assignment that is overwritten was assigned according to colors of the plurality of predefined tracks.

20. A system comprising:
one or more processors configured to:
receive an input including circuit information pertaining to a plurality of semiconductor device components and their logical connections, and pre-coloring information of a circuit portion;

determine, using one or more processors, route information pertaining to a plurality of routes that connect in one or more metal layers the semiconductor device components according to their logical connections, the determination being based at least in part on a plurality of predefined tracks associated with a metal layer and at least according to the pre-coloring information; and output at least a portion of the route information; and one or more memories coupled to the one or more processors, configured to provide the one or more processors with instructions; wherein:

a first portion of the plurality of predefined tracks is pre-assigned a first color and a second portion of the plurality of predefined tracks is pre-assigned a second color;

the first color corresponds to a first pattern that is to be produced using a first mask;

the second color corresponds to a second pattern that is to be produced using a second mask;

the pre-coloring information of the circuit portion indicates that at least some of the plurality of routes of the circuit portion correspond to a user-defined color X, which specifies that the at least some of the plurality of routes of the circuit portion are a single color, but does not require the at least some of the plurality of routes of the circuit portion to be associated with a specific color among available colors as long as the at least some of the plurality of routes of the circuit portion are the same color; and polygons associated with the pre-colored circuit portion are determined to correspond to either the first color or the second color.

21. A computer program product for routing, the computer program product being embodied in a non-transitory computer readable storage medium and comprising computer instructions for:

receiving an input including circuit information pertaining to a plurality of semiconductor device components and their logical connections, and pre-coloring information of a circuit portion;

determining, using one or more processors, route information pertaining to a plurality of routes that connect in one or more metal layers the semiconductor device components according to their logical connections, the determination being based at least in part on a plurality of predefined tracks associated with a metal layer and at least according to the pre-coloring information; and outputting at least a portion of the route information;
   wherein:
a first portion of the plurality of predefined tracks is pre-assigned a first color and a second portion of the plurality of predefined tracks is pre-assigned a second color;
the first color corresponds to a first pattern that is to be produced using a first mask;
the second color corresponds to a second pattern that is to be produced using a second mask;
the pre-coloring information of the circuit portion indicates that at least some of the plurality of routes of the circuit portion correspond to a user-defined color X, which specifies that at least some of the plurality of routes of the circuit portion are a single color, but does not require the at least some of the plurality of routes of the circuit portion to be associated with a specific color among available colors as long as the at least some of the plurality of routes of the circuit portion are the same color; and
polygons associated with the pre-colored circuit portion are determined to correspond to either the first color or the second color.

* * * * *